United States Patent
Fukutome (10) Patent No.: US 8,399,345 B2
(45) Date of Patent: Mar. 19, 2013

(54) SEMICONDUCTOR DEVICE HAVING NICKEL SILICIDE LAYER

(75) Inventor: Hidenobu Fukutome, Kyoto (JP)

(73) Assignee: Fujitsu Semiconductor Limited, Yokohama (JP)

( * ) Notice: Subject to any disclaimer, the term of this patent is extended or adjusted under 35 U.S.C. 154(b) by 94 days.

(21) Appl. No.: 12/964,296

(22) Filed: Dec. 9, 2010

(65) Prior Publication Data
US 2011/0089497 A1 Apr. 21, 2011

Related U.S. Application Data (63) Continuation of application No. PCT/JP2008/001672, filed on Jun. 26, 2008.

(51) Int. Cl.
  H01L 21/3205 (2006.01)
  H01L 21/4763 (2006.01)
(52) U.S. Cl. .................. 438/592; 438/199; 438/585
(58) Field of Classification Search .................. 257/382, 257/384, 408, 412, 413, E21.619, E27.067; 438/223, 300, 585, 587, 588, 592, 199
See application file for complete search history.

(56) References Cited

U.S. PATENT DOCUMENTS

| | | | |
|---|---|---|---|
| 7,432,570 B2 * | 10/2008 | Koyama et al. ........... | 257/412 |
| 2004/0075148 A1 | 4/2004 | Kumagai et al. | |
| 2005/0250326 A1 | 11/2005 | Matsuda | |
| 2008/0090369 A1 | 4/2008 | Akiyama et al. | |
| 2009/0026550 A1 * | 1/2009 | Manabe ........................ | 257/369 |

FOREIGN PATENT DOCUMENTS

| | | | |
|---|---|---|---|
| JP | 2003-086708 A | 3/2003 | |
| JP | 2005-294360 A | 10/2005 | |
| JP | 2007-324187 A | 12/2007 | |
| JP | 2008-078559 A | 4/2008 | |
| JP | 2008-118088 A | 5/2008 | |
| WO | 02/47167 A1 | 6/2002 | |

OTHER PUBLICATIONS

International Search Report of PCT/JP2008/001672, mailing date Sep. 16, 2008.
Sinha, Mantavya et al "Tuning the Schottky barrier height of nickel silicide on p-sillicon by aluminum segregation," Applied Physics Letters, Jun. 6, 2008, vol. 92 No. 22, pp. 222114-1 to 222114-3.
Lee, Rinus T.P. et al "Novel Epitaxial Nickel Aluminide-Silicide with Low Schottky-Barrier and Series Resistance for Enhanced Performance of Dopant-Segregated Source/Drain N-channel MuGFETs," 2007 IEEE Symposium on VLSI Technology Digest of Technical Papers, Jun. 12, 2007, pp. 108-109.

(Continued)

*Primary Examiner* — Hung Vu
(74) *Attorney, Agent, or Firm* — Westerman, Hattori, Daniels & Adrian, LLP (57) ABSTRACT

A method for manufacturing a semiconductor device includes: forming an isolation region for defining a plurality of active regions in a silicon substrate; doping p-type impurities in at least one of the plurality of active regions to form a p-type well; forming an NMOS gate electrode traversing the p-type well via a gate insulating film; implanting n-type impurity ions into the p-type well on both sides of the NMOS gate electrode to form n-type extension regions; forming an NMOS gate side wall spacer on side walls of the NMOS gate electrode; implanting n-type impurity ions into the p-type well outside the NMOS gate side wall spacers to form n-type source/drain regions; forming a nickel silicide layer in surface regions of the n-type source/drain regions; and implanting Al ions the said n-type source/drain regions to dope Al in the nickel silicide layer surface regions.

10 Claims, 9 Drawing Sheets

OTHER PUBLICATIONS

Partial English Translation of Written Opinion of PCT/JP2008/001672, mailing date Sep. 16, 2008.
Mangelinck, D. et al.; Effect of Co, Pt, and Au additions on the stability and epitaxy of NiSi2 films on (111) Si; Journal of Applied Physics, vol. 84, No. 5, Sep. 1, 1998, pp. 2583-2590.
Corni, F. et al.; "Dilute NiPt alloy interactions with Si"; Applied Surface Science, vol. 73, (1993), North—Holland, pp. 197-202.
Japanese Office Action dated Jan. 8, 2013 issued in corresponding Japanese Patent Application No. 2010-517565.

* cited by examiner

FIG. 10C

US 8,399,345 B2

SEMICONDUCTOR DEVICE HAVING NICKEL SILICIDE LAYER

CROSS REFERENCE TO RELATED APPLICATION

This application is a continuation application of an International Patent application PCT/JP2008/001672, filed on Jun. 26, 2008, the whole contents of which are incorporated herein by reference.

FIELD

The embodiments discussed herein are related to a semiconductor device and its manufacture method, particularly to a semiconductor device having a silicide layer and its manufacture method.

BACKGROUND

A silicide layer is formed on a semiconductor region such as source/drain regions and a polysilicon gate electrode of a MOS transistor to form low resistance contact. Silicide forming metal includes titanium, tungsten, molybdenum, cobalt, nickel and the like. Alloy silicide has also been studied. Nickel silicide among others has drawn remarkable attention because nickel silicide has the advantage that even a fine gate electrode has stable resistance.

Nickel silicide added with metal such as Pt for improving heat resistance is formed by a silicidation process using an Ni alloy film made of Ni and metal such as Pt.

In a silicidation process using an Ni alloy film, an Ni alloy film is first deposited on a gate electrode and source/drain diffusion layers. Next, if necessary, a protective film of titanium oxide (TiN) or the like is deposited on the Ni alloy film.

Next, first silicidation heat treatment is performed at a relatively low temperature of 300° C. or lower to form a silicide ((Ni alloy)$_2$Si) film having a composition ratio of 2:1 between Ni alloy and Si on the gate electrode and source/drain diffusion layers.

Next, the protective film and an unreacted portion of the Ni alloy film is selectively removed by wet etching. Second silicidation heat treatment is performed at a relatively high temperature of 300° C. to 400° C. or lower to form a nickel alloy mono silicide film having a low resistance on the gate electrode and source/drain diffusion layers.

Applied Surface Science 73 (1993)197 reports a silicidation process of dilute Ni$_{95}$Pt$_5$ alloy mixing Pt 5% to Ni. Ni segregates first from alloy to underlying Si to form Ni$_2$Si at an alloy-Si interface. At this stage almost all Pt is left in the alloy. With this Ni supply, Ni in a region of the alloy near silicide is removed, and this region changes gradually to a Pt-rich zone. As all Ni atoms react, a portion of Pt diffuses into Ni$_2$Si, reaches and is accumulated at the Si surface to form silicide. Thereafter, Ni$_2$Si is transformed to NiSi. There is a tendency that Pt moves from the silicide-Si surface to an outer surface. As anneal continues further at a high temperature, Pt distributes again.

J. Appl. Phys., 84 (1998)2583 reports that heat resistance is improved by adding platinum (Pt) to nickel silicide.

JP-A-2008-78559 reports that an Ni—Pt alloy layer is formed on an Si substrate by sputtering, primary heat treatment is performed at a temperature of 240° C. to form Ni$_2$Si through silicidation reaction of Ni—Pt alloy and Si, an unreacted Ni—Pt alloy layer is removed, and secondary heat treatment is performed at a temperature of 400° C. to form nickel platinum mono silicide. It is reported that chemical resistance is improved more than without Pt and surface roughness is suppressed. It analyzes that silicide of Pt-rich Ni—Pt alloy is formed on the surface.

JP-A-2008-118088 proposes that after primary heat treatment is performed at a relatively low temperature of 300° C. or lower to react an Ni—Pt film and an underlying silicon surface, an unreacted portion is selectively removed with chemical containing hydrogen peroxide at a temperature of 71° C. or higher, an oxide film being formed on the surface of an Ni—Pt—Si film, and thereafter secondary heat treatment is performed at a relatively high temperature of 300° C. to 400° C. to form a nickel alloy mono silicide film.

JP-A-2007-324187 reports that after an Al film is deposited on an Si surface, heat treatment is performed to form an Al-containing Ni silicide layer, and thereafter heat treatment is performed at, e.g., 650° C. It is reported that Al distributes mainly in an uppermost surface region of the Ni silicide layer. Although an Ni silicide layer on an n-type Si layer has heat resistance lower by about 100° C. than that of an Ni silicide layer on a p-type Si layer, the Al-containing Ni silicide layer demonstrates similar heat resistance both to n-type and p-type Si layers.

The characteristics of additive-containing Ni silicide (NiSi) of an Si device are not still analyzed sufficiently. It is said that NiSi grows in a spike shape. If a top end of a spike reaches near the junction surface, a junction leak current is considered to be increased.

An NiSi layer on an Si surface forms a Schottky contact. As Al is added to NiSi, it is said that a barrier height of Schottky contact lowers. As Pt is added to NiSi, it is said that heat resistance and chemical resistance are improved.

SUMMARY

According to an aspect of the invention, a semiconductor device includes:
a silicon substrate;
a p-type well defined by an isolation region in the silicon substrate;
an NMOS gate electrode formed via a gate insulating film and traversing the p-type well;
an n-type extension region formed in the p-type well on both sides of the NMOS gate electrode;
NMOS gate side wall spacers formed on side walls of the NMOS gate electrode;
n-type source/drain regions formed in the p-type well outside the NMOS gate side wall spacers;
an NMOS transistor silicide layer formed in surface regions of the n-type source/drain regions and made of Al-containing nickel silicide, wherein an Al concentration at a surface of the NMOS transistor silicide layer is 1 atm % or higher and an Al concentration at an interface with silicon is lower than 0.5 atm %;
an insulating film covering the silicon substrate; and
a conductive plug extending through the insulating film and contacting the surface of the silicide layer.

According to another aspect of the invention, a semiconductor manufacture method includes:
forming an isolation region defining a plurality of active regions in a silicon substrate;
doping p-type impurities in at least one of the plurality of active regions to form a p-type well;
forming an NMOS gate electrode traversing the p-type well via a gate insulating film;
implanting n-type impurity ions into the p-type well on both sides of the NMOS gate electrode to form n-type extension regions;

forming an NMOS gate side wall spacer on side walls of the NMOS gate electrode;

implanting n-type impurity ions into the p-type well outside the NMOS gate side wall spacers to form n-type source/drain regions;

forming a nickel silicide layer in surface regions of the n-type source/drain regions; and implanting Al ions toward the n-type source/drain regions to dope Al in the nickel silicide layer surface regions.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The present inventor has considered positive adjustment of a Schottky barrier by adding Al to nickel silicide. Samples were formed actually and measured to check the influence of adding Al to an Ni silicide layer. Description will be made in the following on manufacture processes for samples used for experiments.

Figure 1A:
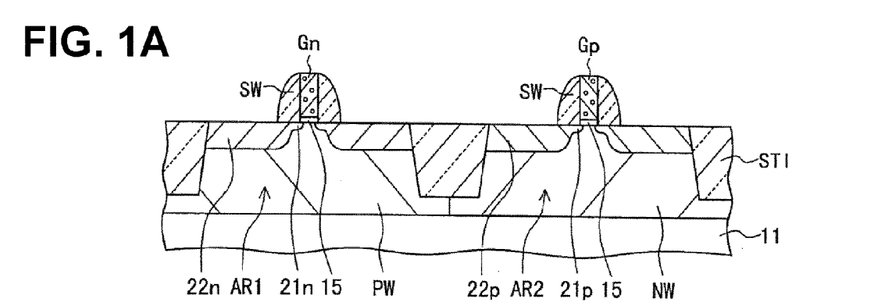
FIGS. 1A to 1D are cross sectional views of a silicon substrate illustrating manufacture processes for a CMOS semiconductor device.

As illustrated in FIG. 1A, a CMOS transistor structure was formed on a silicon substrate 11. The silicon substrate has (110) plane. An isolation STI is formed by shallow trench isolation to a depth of about 300 nm in the silicon substrate 11 to define active regions AR1 and AR2. A p-type well PW is formed by implanting p-type impurity ions into the active region AR1, and an n-type well NW is formed by implanting n-type impurity ions into the active region AR2.

A gate insulating film 15 is formed on an active region surface, a polysilicon layer is deposited on the gate insulating film 15, and the polysilicon layer is patterned by using a resist pattern to form gate electrodes Gn and Gp. In order to measure also gate length dependency, the gate lengths of samples were changed mainly from about 30 nm to about 100 nm. For mobility measurements, MOS transistors having a gate length of about 1 μm were formed.

By using the gate electrodes as a mask, impurity ions of a conductivity type opposite to active regions are implanted into the active regions on both sides of the gate electrodes to form extension regions 21n and 21p. For example, for the p-type well PW, As ions are implanted at an acceleration energy of 1 keV and a dose of $1 \times 10^{15}$ cm$^{-2}$. For the n-type well NW, B ions are implanted. Implanted ions are activated to obtain the extension regions having a depth of about 30 nm. "$\times 10^{14}$" is noted as "E14" in some cases. In order to adjust a protruding amount of the extension region under the gate electrode, ion implantation may be performed after an offset spacer is formed by a silicon oxide film or the like.

A silicon oxide film is deposited, and anisotropic etching is performed by reactive ion etching (RIE) to leave side wall spacers SW on the side walls of the gate electrode. The side wall spacer may have any structure such as a lamination structure of a silicon oxide film and a silicon nitride film. A width of the side wall spacer is about 30 nm. By using the gate electrode structure having the side wall spacers as masks, impurity ions of conductivity types opposite to those of the wells are implanted to form source/drain regions 22n and 22p. For example, for the p-type well PW, n-type impurity ions P are implanted at an acceleration energy of 5 keV and a dose of 1E16 cm$^{-2}$. For the n-type well NW, p-type impurity ions B are implanted at an acceleration energy of 2.5 keV and a dose of 5E15 cm$^{-2}$. Implanted ions are activated to obtain source/drain diffusion layers having a depth of about 35 nm. The extension regions and source/drain diffusion layers are collectively called source/drain regions in some cases.

Figure 1B:
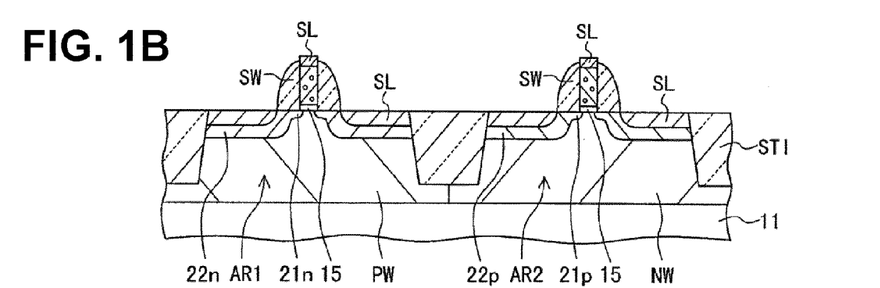

As illustrated in FIG. 1B, a nickel (Ni) layer containing platinum (Pt) was deposited on the silicon substrate by sputtering. Primary anneal was performed at about 240° C., unreacted Ni—Pt was removed, and thereafter secondary anneal was performed at about 400° C. Silicide regions SL having NiSi as main components (containing 90 atm or more) on the exposed silicon surface. A thickness of the silicide region SL is, e.g., about 20 nm.

Figure 1C:
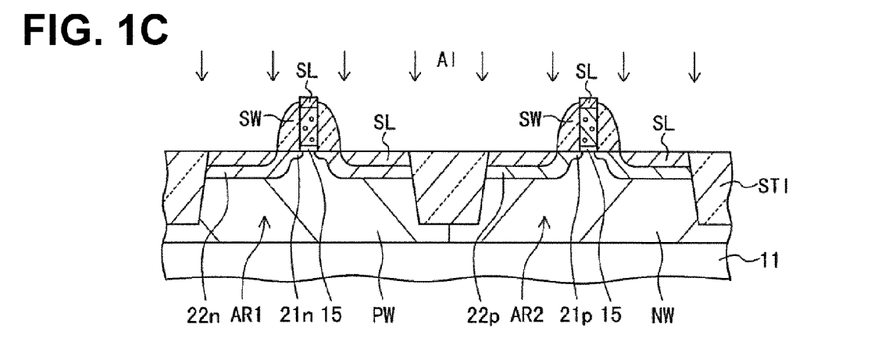

As illustrated in FIG. 1C, Al ions are implanted into the silicide layer SL. Al ions are implanted into the NiSi layer having a thickness of 20 nm at an acceleration energy of 0.5 keV to 5 keV, e.g., 3 keV and a dose of 1E15 cm$^{-2}$ to 2E16 cm$^{-2}$, e.g., 8E15 cm$^{-2}$. In order to implant Al ions into the NiSi layer and not to implant Al ions into the conductive layers and semiconductor layers other than the silicide layers, it is preferable to implant ions vertically (at a tilt angle of 0 degree).

Figure 1D:
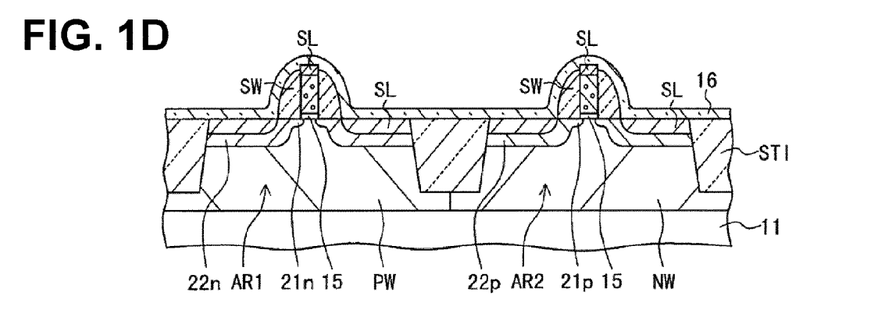

As illustrated in FIG. 1D, after Al ions are implanted, an insulating film 16 of SiN or the like is formed by plasma CVD at 200° C. to 500° C., e.g., about 400° C. A silicon oxide film as an interlayer insulating film is formed on the insulating film 16 at a temperature of 400° C. At this film forming temperature, NiSi recrystallization and Al diffusion occur. Dedicated heat treatment is not performed. Samples were formed having NMOS transistors with various gate lengths in the p-type well. For comparison, samples without Al ion implantation illustrated in FIG. 1C were formed on an additional substrate.

A surface concentration of Al is sufficiently high for lowering a contact resistance, and an Al concentration at an interface of silicide/silicon is desired to have a concentration at a degree that a Schottky barrier is lowered without adverse affects (about E17 $cm^{-3}$ to E19 $cm^{-3}$). A steep concentration gradient is desired.

A concentration distribution of Si, Ni, Pt and Al in an n-type source/drain diffusion layers in a depth direction from the surface was analyzed by energy dispersive X ray (EDX) spectroscopy. A detection limit of EDX is about 0.5 atm %.

Figure 2A:
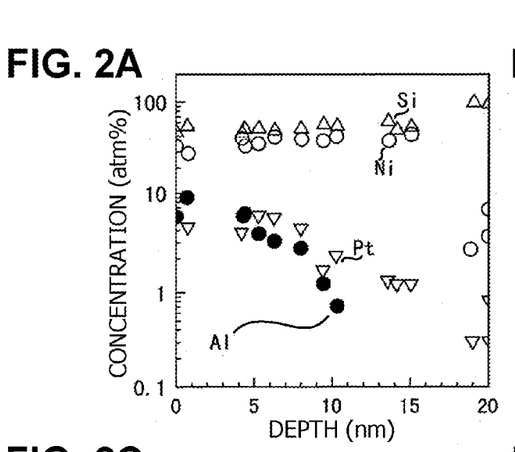
FIGS. 2A and 2B are graphs illustrating EDX analysis results of source/drain regions in a depth direction.
Figure 2B:
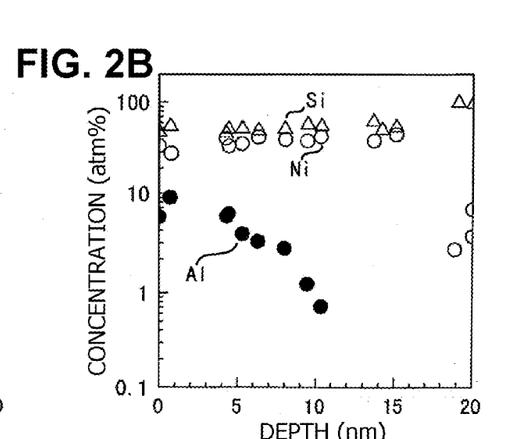

FIG. 2A is a graph illustrating a depth direction distribution of Si, Ni, Pt and Al in the n-type source/drain regions $22n$ measured by EDX. The abscissa represents a depth from the surface in the unit of nm, and the ordinate represents an element concentration in the unit of atm %. Since Pt is an optional constituent element, a graph omitting Pt concentration plots is illustrated in FIG. 2B.

Ni concentration plots are almost constant at about 30 to 40 atm % from the surface to a depth of about 15 nm, and then lower to about 3 to 7 atm % at a depth of 19 to 20 nm. Si concentration plots are about 40 atm % to a depth of about 15 nm, and reach near 100 atm % at a depth of 19 to 20 nm. It is considered that NiSi silicide is formed from the surface to a depth of about 15 nm.

An Al concentration lowers steeply as the depth from the surface increases. The Al concentration is uniform in the in-plane directions. Grain boundary diffusion and grain boundary concentration are not observed. The Al concentration is about 6 to 10 atm % in the surface layer, and 1 atm % or lower at a depth of 10 nm. It is sure that the concentration at a depth of 10 nm becomes lower than one fifth the surface concentration; one tenth or lower at high possibility. It is predicted that an Al concentration at a depth of 15 nm on the silicide layer bottom is lower than 0.5 atm % at the highest; possibly lower than 0.1 atm %. It is considered that this steep distribution is formed by not performing a high temperature process after Al ion implantation after a silicidation process. It is possible to set an Al concentration at a silicide layer surface to 1 atm % or higher, and lower than 0.5 atm % at a silicide/silicon interface.

A Pt concentration lowers as the depth from the surface becomes deeper, although a reduction degree is fairly gentler than Al. The Pt concentration is about 5 to 10 atm % in the surface layer, about 2 atm % at a depth of 10 nm, a little more than 1 atm % at a depth of 15 nm, and about 0.3 to 0.8 atm % at a depth of 19 to 20 nm. A concentration at a depth of 10 nm may be one fifth or more than a surface layer concentration. Pt is an element having slower diffusion by its nature than Al. Gentler and deeper distribution than Al is formed because Pt is deposited together with Ni and undergoes a silicidation processes.

Figure 2C:
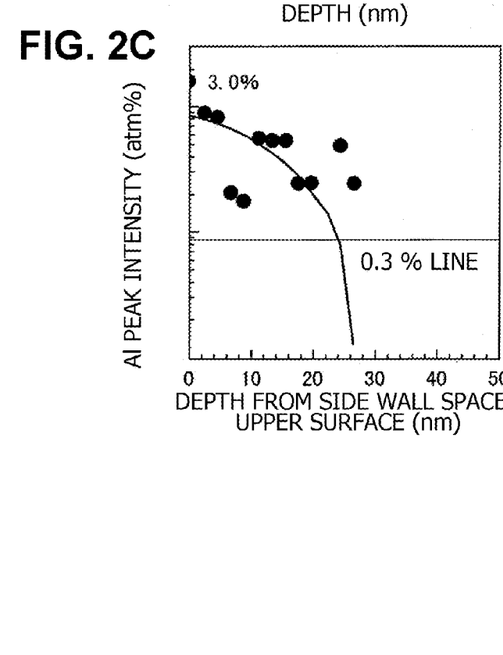
FIGS. 2C and 2D are a graph illustrating EDX analysis results of a side wall in a depth direction and an electron microscopic photograph of a side wall.
Figure 2D:
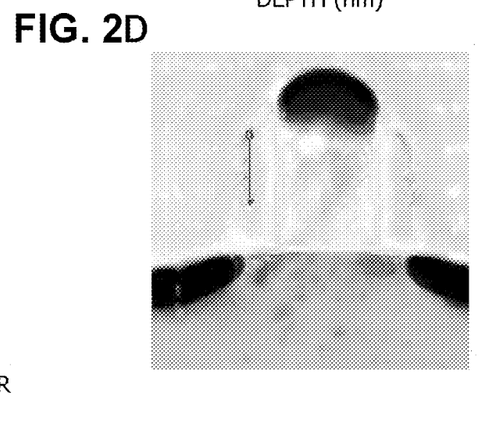

FIG. 2C illustrates measurement results of an Al concentration in the side wall spacer SW at the position spaced by about 5 nm from the gate electrode side wall. The abscissa represents a depth from the side wall spacer upper surface in the unit of nm, and the ordinate represents Al concentration in the unit of atm %. FIG. 2D is an electron microscopic photograph of the measured side wall spacer. An Al concentration at the side wall spacer upper surface layer was 3 atm % in quantitative evaluation. An Al peak intensity distribution in the side wall spacer in the depth direction was extracted from an EDX distribution image. It is seen that Al having a concentration of 0.3 atm % or higher does not exist at a depth of 30 nm or deeper. It has been found from the EDX results that an Al concentration in the side wall spacer bottom portion is one tenth or lower than an Al concentration near at the upper surface. Namely, an Al concentration in the side wall spacer lowers by one digit or more from the upper surface toward the lower portion.

The characteristics of NMOS transistors with and without Al implantation were measured. A junction leak current was measured by applying a reverse bias across the source/drain region $22n$ of the NMOS transistor and the p-type well PW. Data of samples without Al implantation is represented by black or white triangles, and data of samples with Al implantation is represented by black or white circles.

Figure 3A:
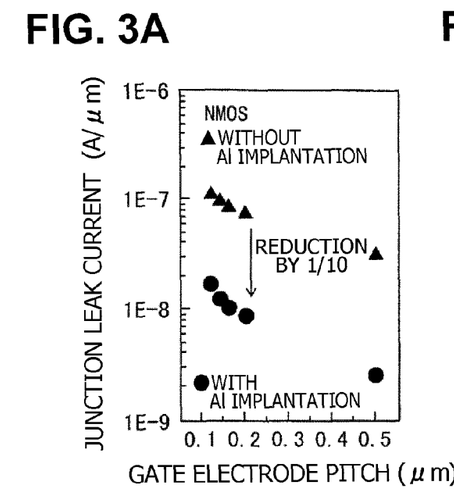
FIGS. 3A and 3B are a graph illustrating a relation between a gate pitch and junction leak current of source/drain regions and a graph illustrating a cumulative frequency (probability) of junction leak current.

FIG. 3A is a graph illustrating measurement results of a dependency of a junction leak current upon a gate electrode pitch. The abscissa represents a gate electrode pitch in the unit of μm, and the ordinate represents a junction leak current JL in the unit of A/μm. Irrespective of whether Al implantation was performed or not, as the gate electrode pitch becomes narrow, a junction leak current increases. As compared to the leak current of samples without Al implantation, a leak current of samples with Al implantation reduces by about one tenth.

Figure 3B:
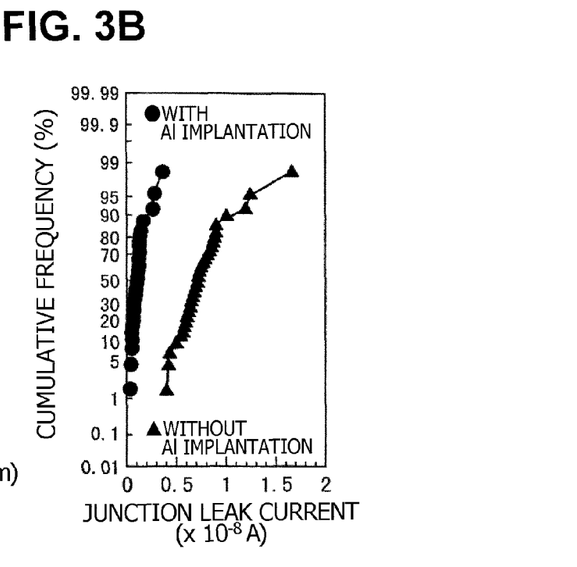

FIG. 3B illustrates results of plotting again the same data as a cumulative frequency relative to a junction leak current. As compared to the samples without Al implantation, the samples with Al implantation have a smaller leak current and a very narrow distribution range of the leak current.

One of the objects of adding Al to NiSi is to lower a contact resistance between a conductive plug and a silicide layer. Contact resistances were checked by forming a conductive plug near the side wall spacer SW on the n-type source/drain region $22n$ of an NMOS transistor and near STI.

Figure 3C:
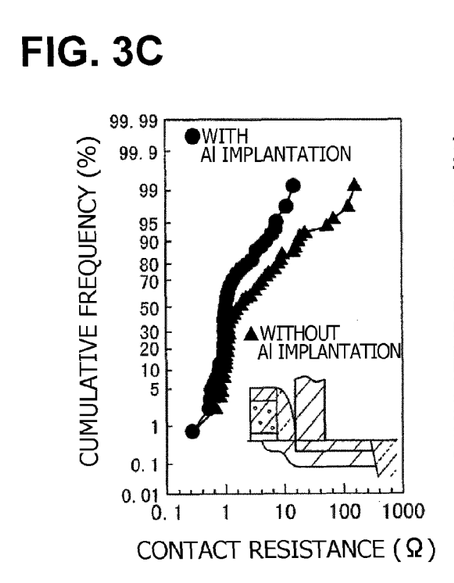
FIGS. 3C and 3D are graphs illustrating cumulative frequencies (probability) of a contact resistance of a silicide region at two positions of a source/drain region.
Figure 3D:
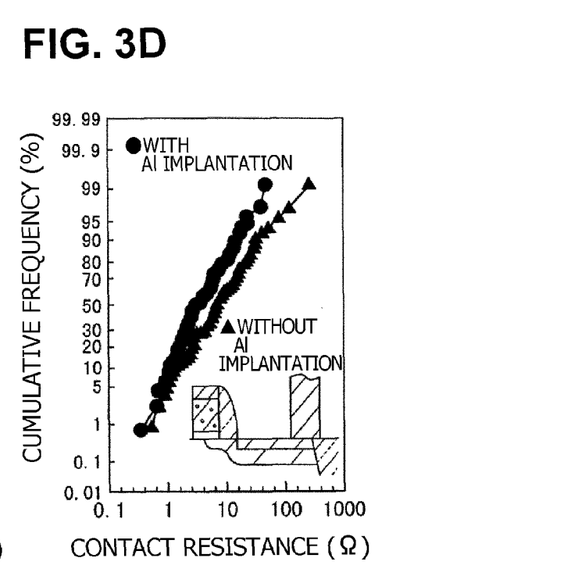

FIG. 3C illustrates a cumulative frequency of a contact resistance of the conductive plug formed near a side wall spacer, and FIG. 3D illustrates a cumulative frequency of a contact resistance of the conductive plug formed near STI. At a median of 50% for example, Al implantation lowers a contact resistance both near the side wall spacer and near STI. In the NMOS transistor, it becomes possible to lower a contact resistance by implanting Al ions into the NiSi silicide layer.

The phenomenon that as a gate length is shortened, a threshold voltage generally lowers, is called a short channel effect. Description will be made in the following on a threshold voltage lowering phenomenon caused by the short channel effect in samples.

Figure 4A:
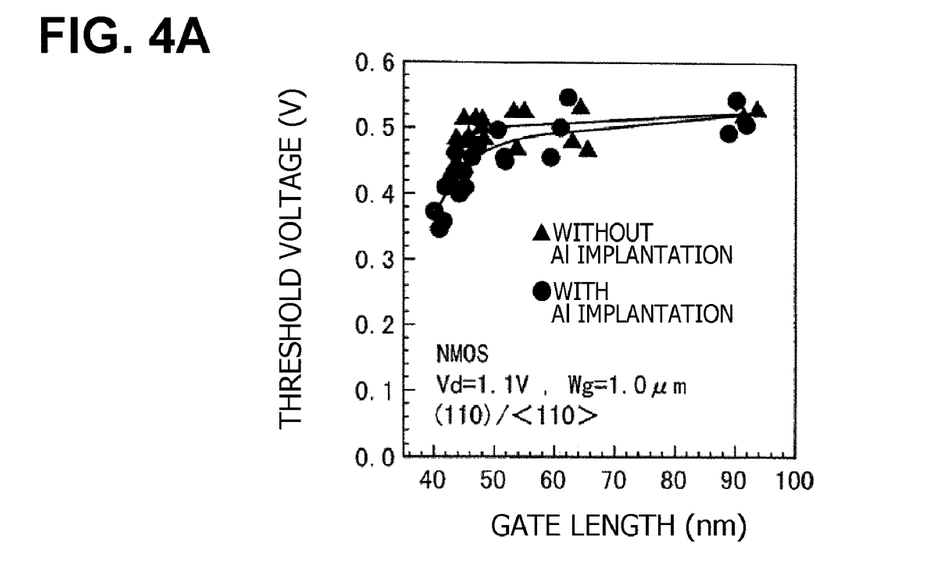
FIGS. 4A and 4B are graphs illustrating a relation between a gate length and a threshold voltage and between a gate length and an off-current.
Figure 4B:
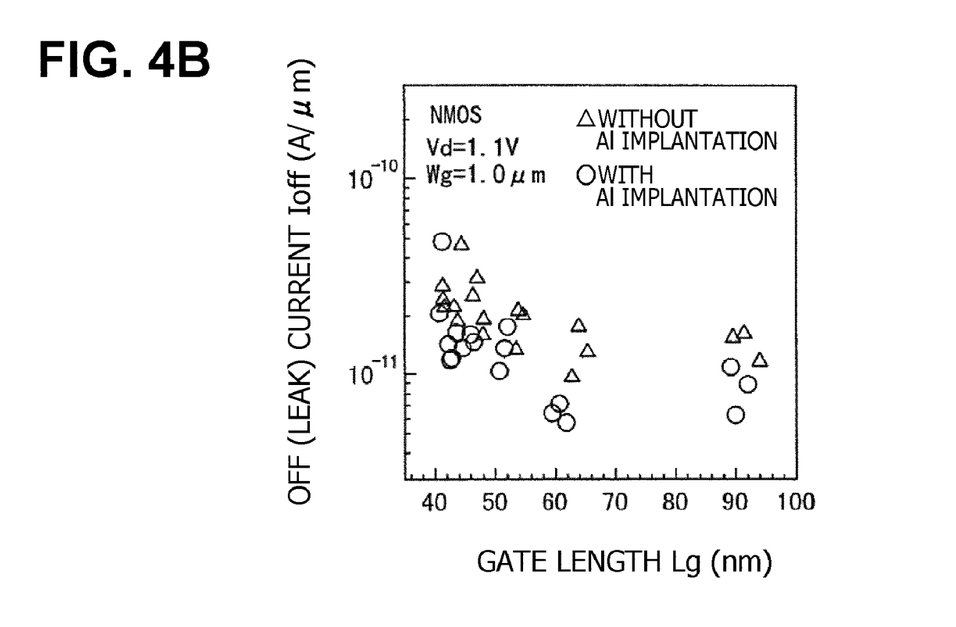

FIG. 4A is a graph illustrating a relation between a gate length and a threshold voltage, and FIG. 4B is a graph illustrating a relation between a gate length and an off-current Ioff. As illustrated in FIG. 4A, there is a tendency that among NMOS transistors having a short channel (short gate length), a threshold voltage of a sample with Al implantation becomes lower than that of a sample without Al implantation. As will be later described, this lowered threshold voltage does not mean degraded characteristics. As illustrated in FIG. 4B, it can be seen that at the same gate length, an off-current Ioff of a sample with Al implantation becomes smaller than that Ioff of a sample without Al implantation. It indicates a possibility of logical operation even if a threshold voltage is low.

Figure 5:
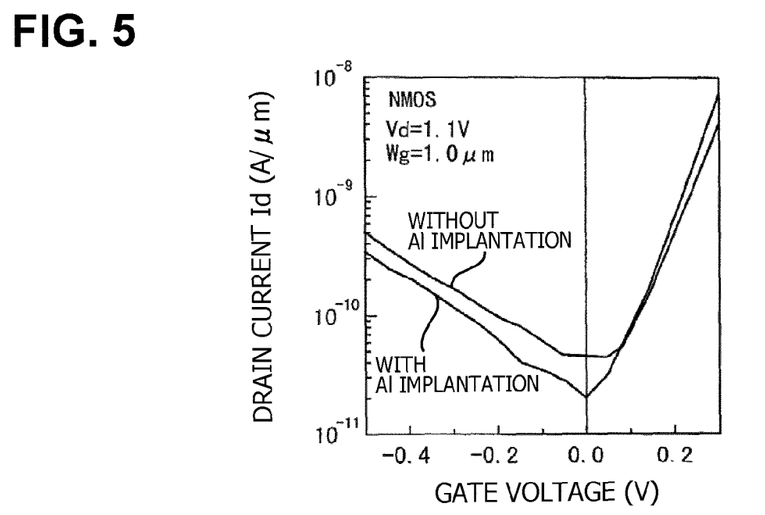
FIG. 5 is a graph illustrating a relation between a gate voltage and a drain current.

FIG. 5 is a graph illustrating a change in a drain current relative to a gate voltage. The abscissa represents a gate voltage Vg in the unit of V, and the ordinate represents a drain current Id in the unit of A/μm. A drain voltage is 1.1 V. As compared to the characteristics of an NMOS transistor without Al implantation, the characteristics of an NMOS transistor with Al implantation indicate that the drain current Id is lower in a negative region of the gate voltage Vg, and the drain current Id (off-current) at Vg=0 is also lower. In a positive region of the gate voltage Vg, the drain current Id rises steeply and is larger than that of the NMOS transistor without Al implantation.

The off-current is governed not by a sub-threshold leak current but by a gate induction drain leak (junction leak) current. As illustrated in FIG. 3A, since the junction leak current lowers by Al implantation, the off-current becomes smaller. An operation with small noises becomes possible.

Figure 6:
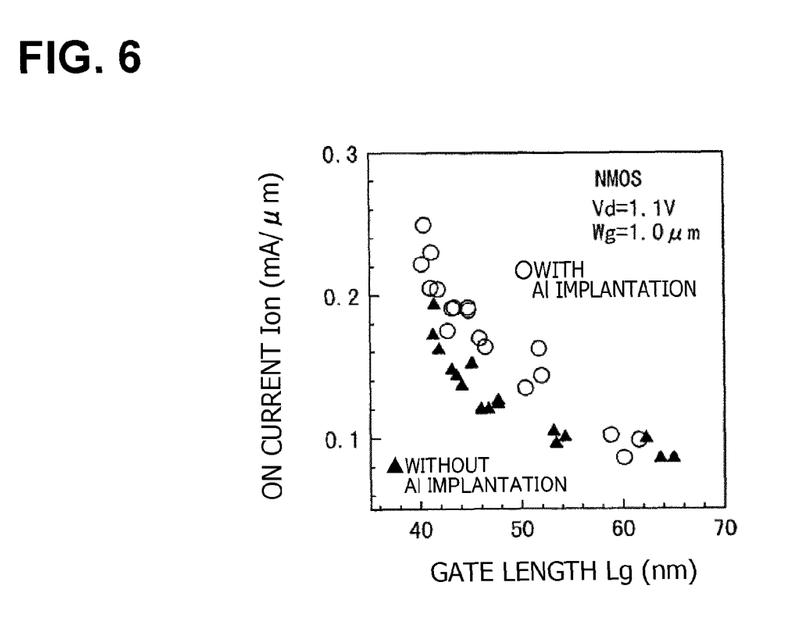
FIG. 6 is a graph illustrating an on-current distribution relative to a gate voltage.

FIG. 6 is a graph illustrating a relation between a drain on-current Ion and a change in a gate length Lg. The abscissa represents a gate length Lg in the unit of nm, and the ordinate represents an on-current Ion in the unit of mA/μm. It is apparent that among NMOS transistors having a short gate length Lg, the on-current Ion of the transistor with Al implantation becomes larger that of the transistor without Al implantation. Since the off current becomes small and the on-current becomes large, a better logical operation becomes possible.

Figure 7A:
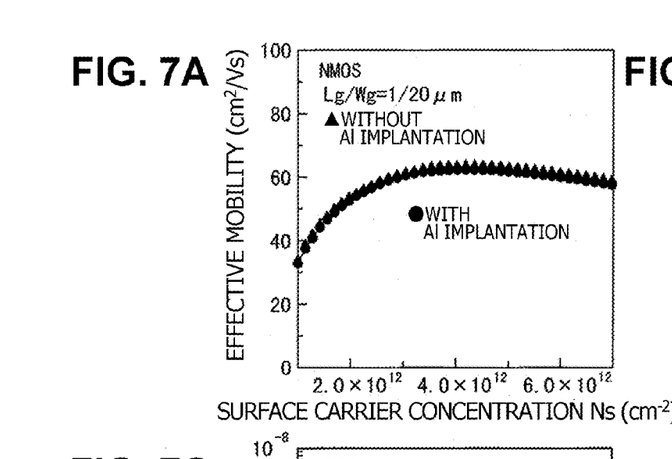
FIG. 7A is a graph illustrating a relation between a surface carrier concentration (Ns) and an effective mobility.

FIG. 7A is a graph illustrating a relation between an effective mobility ($cm^2 \cdot Vs$) indicated on the ordinate and a change in a surface carrier concentration Ns ($cm^{-2}$). NMOS transistors having a gate length Lg of him and a gate width Wg of 20 μm were measured. A channel mobility is measured by using NMOS transistors having a sufficiently long gate length. As compared to the transistor without Al implantation, although an effective mobility of the transistor with Al implantation lowers by about 2%, it is considered that Al implantation hardly influences an electron mobility. An increase in the on-current may be ascribed to a factor other than a mobility; a change in a barrier height of a Schottky junction with respect to electrons.

Figure 7B:
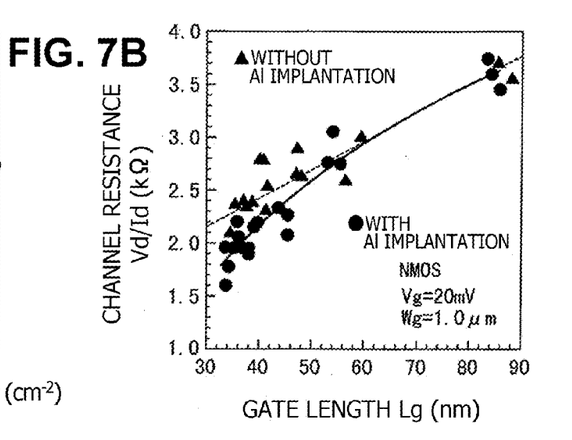
FIG. 7B is a graph illustrating a relation between a gate length and a channel resistance.

FIG. 7B is a graph illustrating a change in Vd/Id (channel resistance) (kΩ) indicated on the ordinate relative to a gate length Lg (nm) indicated on the abscissa. At a gate length of 60 nm or longer, the Al implantation influence is not recognized. At a gate length shorter than 60 nm, particularly at a short channel shorter than 45 nm, it is seen that a channel resistance becomes small by Al implantation.

Since samples are formed on a (110) Si substrate, an electron mobility is low. If a channel length is long, a channel resistance becomes high because of a low mobility. As the channel is made short, the low mobility influence becomes small. The phenomenon that a channel resistance lowers by Al implantation may be ascribed to a lowered parasitic resistance of the source/drain regions caused by a lowered barrier height of a Schottky contact with respect to electrons, at an NiSi/Si interface by Al implantation.

Figure 7C:
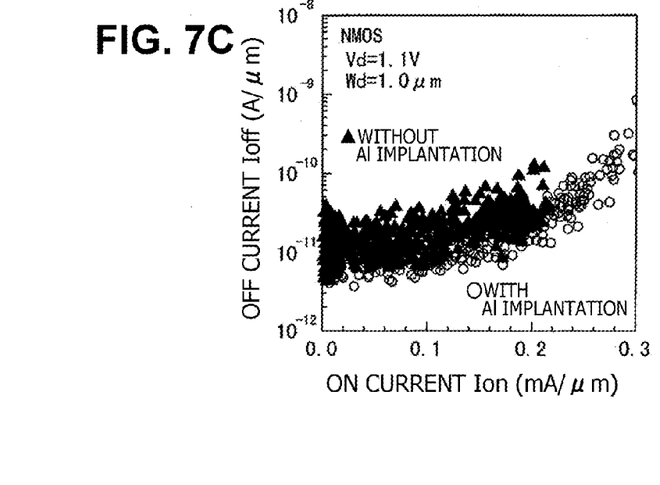
FIG. 7C is a graph illustrating a relation between an on-current and an off-current.

FIG. 7C is a graph illustrating a relation between an off-current Ioff and an on-current Ion. The abscissa represents an of-current Ion in the unit of mA/μm, and the ordinate represents an off-current Ioff in the unit of A/μm. It is seen that the on-current Ion increases by Al implantation under the condition that the off-current Ioff is constant. It indicates that under the condition that Ion is constant, with Al implantation, the leak current becomes small, noises are reduced and a consumption power becomes small.

The NMOS transistor has been described. The influence of Al implantation upon a PMOS transistor will be described next. A PMOS transistor formed on a (110) Si substrate has a high mobility and a small channel resistance.

Figure 8A:
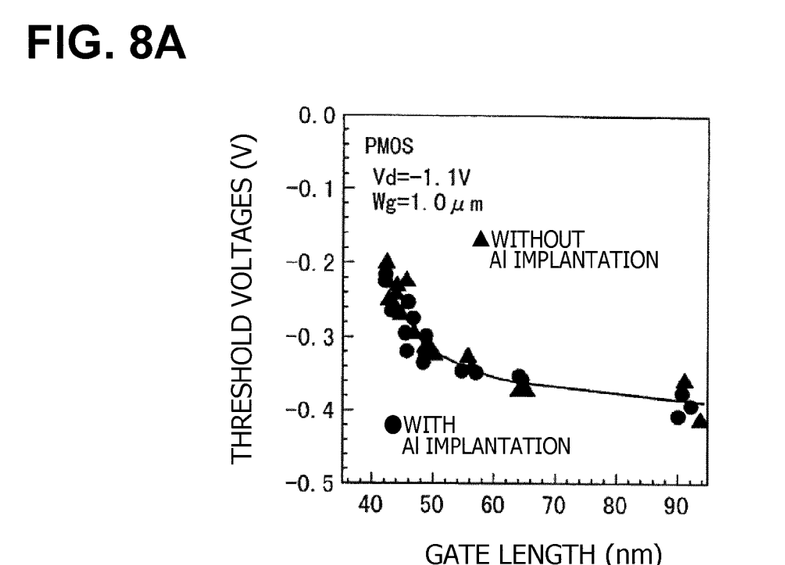
FIG. 8A is a graph illustrating a relation between a gate length and a threshold voltage.

FIG. 8A is a graph illustrating a change in a threshold voltage indicated on the ordinate relative to a gate length indicated on the abscissa. As the gate length becomes short, an absolute value of a threshold voltage becomes small. There is no influence whether Al implantation is performed or not.

Figure 8B:
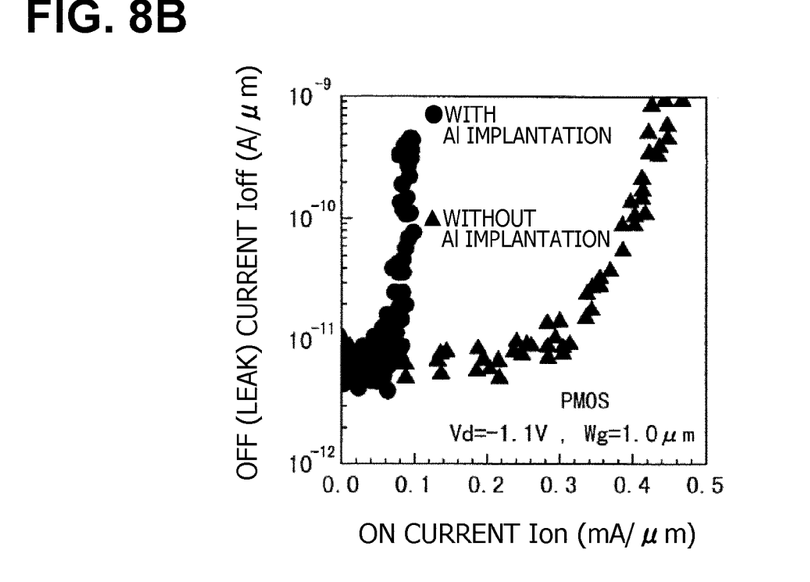
FIG. 8B is a graph illustrating a relation between an on-current and an off-current.

FIG. 8B is a graph illustrating a relation between an off-current Ioff indicated on the ordinate and an on-current Ion indicated on the abscissa. An on-current Ion lowers as much as 75% by Al implantation under the condition that the off-current is constant. This may be ascribed to the influence of an increased barrier height, with respect to holes, of Schottky contact at an NiSi/Si interface. This corresponds to a tail of a coin having a head of lowed barrier height, relative to electrons, of Schottky contact of an NMOS transistor.

In order to avoid a degraded performance of a PMOS transistor, it is desired to perform Al implantation only for NMOS transistors.

Description will now be made on a CMOS semiconductor device according to an embodiment based on the above-described experiment results.

Figure 9A:
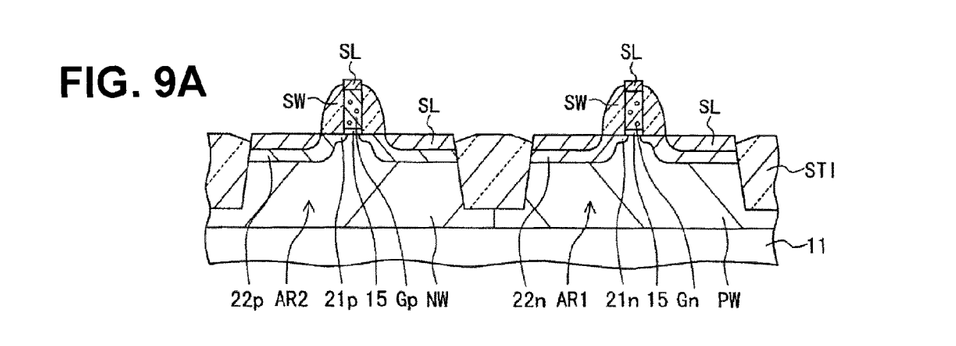
FIGS. 9A to 9D are cross sectional views of a silicon substrate illustrating an embodiment in which Al is introduced into a silicide region of only an NMOS transistor.

As illustrated in FIG. 9A, a CMOS structure is formed on a silicon substrate 11. An isolation region STI is formed in the silicon substrate 11 by shallow trench isolation to a depth of about 300 nm to define active regions AR1 and AR2. Impurities of p-type ions are implanted into the active region AR1 to form a p-type well PW, and impurities of n type ions are implanted into the active region AR2 to form an n-type well NW.

A gate insulating film 15 containing a silicon oxide film and having a thickness of, e.g., 1.2 nm to 2.0 nm, is formed on the surfaces of the active regions, a polysilicon layer having a thickness of 80 nm to 120 nm is deposited on the gate insulating film 15, and the polysilicon layer is patterned by using a resist pattern to form gate electrodes Gp and Gn. A gate length used mainly is about 30 nm to 60 nm, e.g., 40 nm.

For the p-type well PW, n-type impurity ions are implanted shallowly to form n-type extension regions 21n. For example, As ions are implanted at an acceleration energy of 1 keV and a dose of 1E15 $cm^{-2}$. For the n-type well NW, p-type impurity ions are implanted shallowly to form p-type extension regions 21p. For example, B ions are implanted at an acceleration energy of 0.3 keV and a dose of 1E15 $cm^{-2}$. In order to adjust a protruding amount of the extension region under the gate electrode, ion implantation may be performed after an offset spacer is formed by a silicon oxide film or the like. A pocket region surrounding the extension region and having an opposite conductivity type may be formed by oblique ion implantation. C, F, N or the like capable of controlling impurity diffusion may be additionally implanted. Implanted ions are activated to obtain the extension regions having a depth of about 30 nm. If necessary, activation at this stage may be omitted.

An insulating film such as a silicon oxide film is deposited on the whole substrate surface, and anisotropic etching is performed to form side wall spacers SW on the side walls of the insulated gate electrodes Gn and Gp in NMOSFET and PMOSFET regions, respectively. A width of the side wall spacer SW is, e.g., 40 nm. For the p-type well PW, n-type impurities are implanted deeply to form n-type source/drain regions 22n. For example, n-type impurity ions P are implanted at an acceleration energy of 5 keV and a dose of 1E16 $cm^{-2}$. For the n-type well NW, p-type impurities are implanted deeply to form p-type source/drain regions 22p. For example, p-type impurity ions B are implanted at an acceleration energy of 2.5 keV and a dose of 5E15 $cm^{-2}$. Implanted ions are activated to obtain source/drain regions having a depth of about 35 nm.

A platinum (Pt)-containing nickel (Ni) layer is deposited on the silicon substrate by sputtering, and a silicidation reaction is performed to form silicide regions SL on the exposed silicon surfaces. A nickel silicide layer containing Pt and having a thickness of 20 nm to 25 nm is formed. Although Pt-containing Ni is used as a metal layer, Ni may not contain Pt.

Figure 9B:
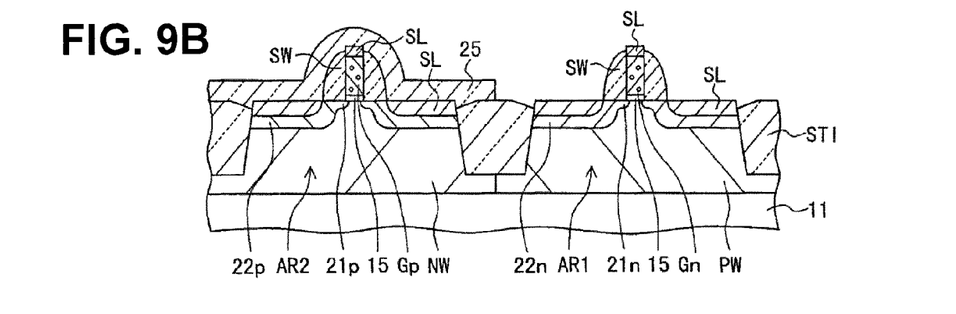

As illustrated in FIG. 9B, an insulating film 25 of, e.g., silicon oxide, is deposited on the whole substrate surface by chemical vapor deposition (CVD) to a thickness of 10 nm to 20 nm. By covering the PMOS region with a resist mask, the insulating film 25 in the NMOS region is etched and removed to expose the NMOS structure.

Figure 9C:
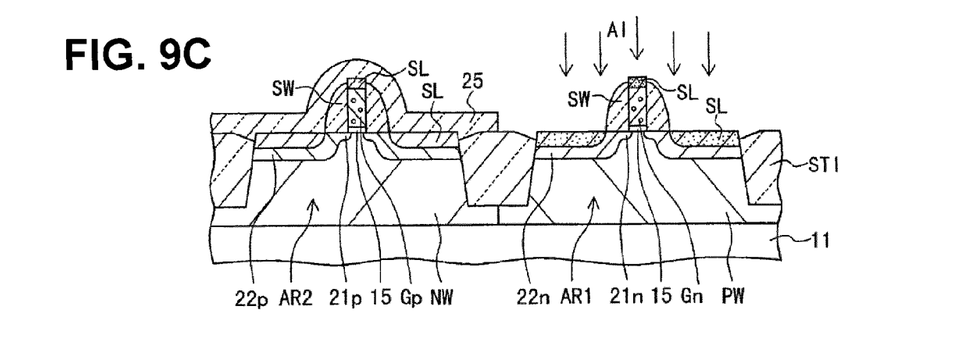

As illustrated in FIG. 9C, Al ions are implanted into the NMOS structure. For example, Al ions are implanted into NiSi having a thickness of 20 nm at an acceleration energy of 0.5 to 5.0 keV and a dose of 1E15 to 2E16 cm$^{-2}$. Al ions are not implanted into the PMOS structure because the PMOS structure is covered with the insulating film 25.

Figure 9D:
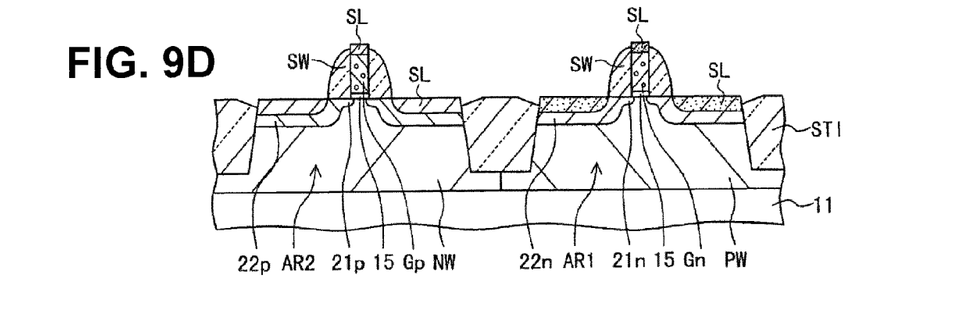

As illustrated in FIG. 9D, the insulating film 25 used as a mask is removed. Thereafter, basing upon the well-known techniques, as an etch stopper film, a tensile stress silicon nitride film is formed on the NMOS structure, and a compressive stress silicon nitride film is formed on the PMOS structure. A lower interlayer insulating film of silicon oxide or the like is formed on the etch stopper film. Conductive plugs are formed reaching the transistors through the lower interlayer insulating film and etch stopper film. Interlayer insulating films are further formed to form multi layer wirings. For semiconductor device well-known techniques, refer to, e.g., U.S. Pat. Nos. 6,949,830 and 7,208,812, the whole content of which is herein incorporated by reference.

In the above-described embodiment, in order not to implant Al ions into the PMOS structure, the hard mask layer is formed and after Al ion implantation, it is removed. In the CMOS structure using a stress film, the stress film may be used as the hard mask. Processes up to forming the NiSi regions are performed in the manner similar to the above-described embodiment.

Figure 10A:
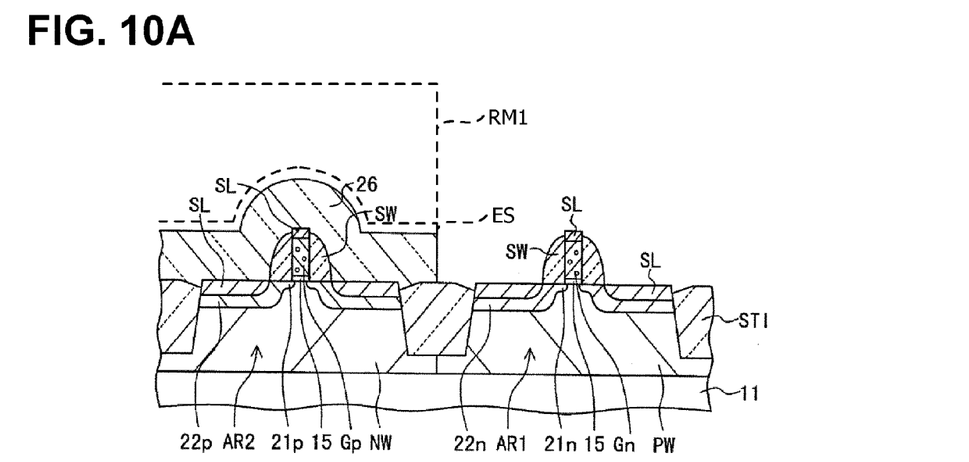
FIGS. 10A to 10C are cross sectional views of a silicon substrate illustrating an embodiment in which Al is introduced only into a silicide region of an NMOS transistor by using selective formation of respective contact etch stoppers (stress films).

As illustrated in FIG. 10A, a stress film 26 having a compressive stress is formed on the whole substrate surface. For example, a compressive stress silicon nitride film is deposited on the whole silicon substrate to a thickness of 60 nm to 80 nm. The compressive stress silicon nitride film 26 is deposited under the conditions that silane (SiH$_4$) is supplied as silicon source at a flow rate of 100 sccm to 1000 sccm, NH$_3$ is supplied as N source at a flow rate of 500 sccm to 10000 sccm, N$_2$ or Ar is supplied as carrier gas at a flow rate of 500 sccm to 10000 sccm to perform plasma CVD at a pressure of 0.1 Torr to 400 Torr, a substrate temperature of 400° C. to 450° C. and a radio frequency (RF) power of 100 W to 1000 W. A compressive stress is, e.g., 2.5 GPa.

A resist mask RM1 is formed covering the PMOS region, and the silicon nitride film 26 in the NMOS region is removed by reactive ion etching using CHF$_3$/Ar/O$_2$ gas. The resist mask RM1 is thereafter removed.

Figure 10B:
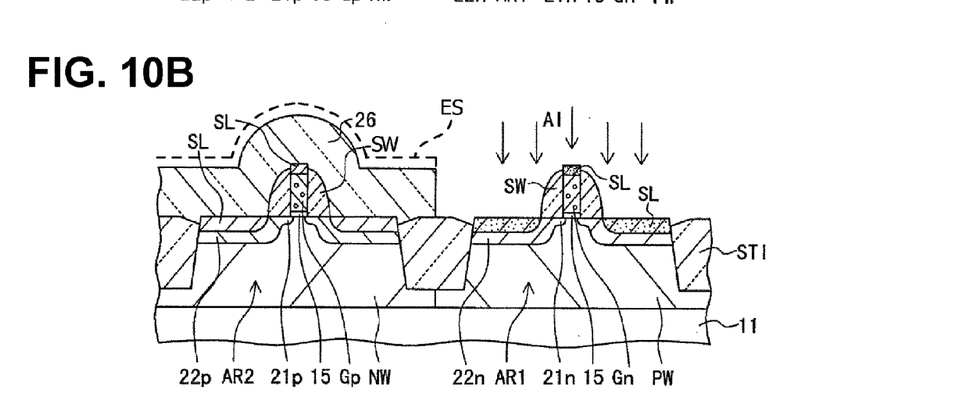

As illustrated in FIG. 10B, Al ions are implanted. This process is similar to that illustrated in FIG. 9C. Since the PMOS region is covered with the compressive stress silicon nitride film, Al ions are not implanted into the PMOS region. The resist mask may be removed after Al ion implantation.

Figure 10C:
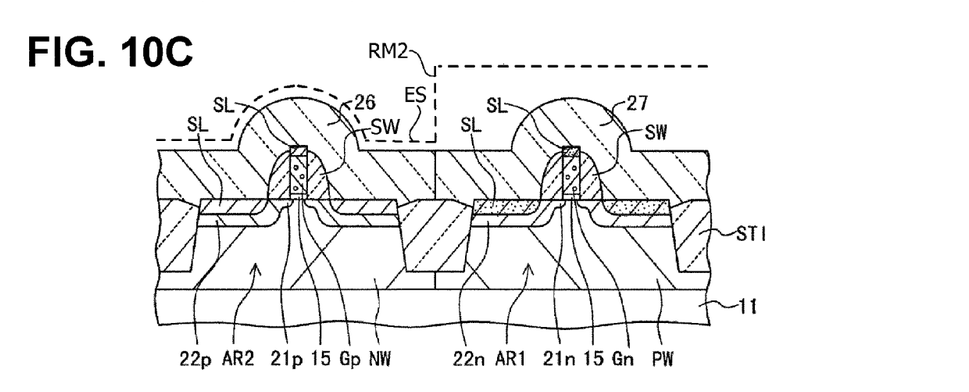

As illustrated in FIG. 10C, a tensile stress film is formed covering the NMOS region. For example, a silicon nitride film 27 having a thickness of 60 nm to 80 nm and a tensile stress is deposited on the silicon substrate.

The tensile stress silicon nitride film 27 is deposited under the conditions that dichlor silane (SiCl$_2$H$_2$), silane (SiH$_4$), disilane (Si$_2$H$_6$), or trisilane (Si$_3$H$_8$) is supplied as silicon source at a flow rate of 5 sccm to 50 sccm, NH$_3$ is supplied as N source at a flow rate of 500 sccm to 10000 sccm, N$_2$ or Ar is supplied as carrier gas at a flow rate of 500 sccm to 10000 sccm to perform thermal CVD at a pressure of 0.1 Torr to 400 Torr, and a substrate temperature of 400° C. to 450° C. A tensile stress is, e.g., 1.7 GPa.

A resist mask RM2 is formed covering the NMOS region, and the tensile stress silicon nitride film in the PMOS region is removed by reactive ion etching using CHF$_3$/Ar/O$_2$ gas.

A silicon oxide film may be deposited as an etching stopper ES on the tensile stress silicon nitride film 26 to be patterned in the same shape as the silicon nitride film 26 in the NMOS region. The silicon oxide film is able to be etched by reactive ion etching using C$_4$F$_8$/Ar/O$_2$ gas. The silicon oxide film functions as an etching stopper while the tensile stress silicon nitride film 27 is etched.

The present invention has been described with reference to the experiments made by the present inventor and the embodiments, the present invention is not limited thereto, but it is obvious to those skilled in the art that various modifications, substitutions, improvements, combinations and the like are possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a semiconductor device, comprising:
   forming an isolation region for defining a plurality of active regions in a silicon substrate;
   doping p-type impurities in at least one of said plurality of active regions to form a p-type well;
   forming an NMOS gate electrode above said p-type well via a gate insulating film, traversing said p-type well;
   implanting n-type impurity ions into said p-type well on both sides of said NMOS gate electrode to form n-type extension regions;
   forming NMOS gate side wall spacers on side walls of said NMOS gate electrode;
   implanting n-type impurity ions into said p-type well outside said NMOS gate side wall spacers to form n-type source/drain regions;
   forming nickel silicide layers in surface regions of said n-type source/drain regions; and
   implanting Al ions toward said n-type source/drain regions to dope Al in surface regions of said nickel silicide layers.

2. The method for manufacturing a semiconductor device according to claim 1, wherein said forming said nickel silicide layers comprises:
   depositing a nickel layer on said silicon substrate;
   performing an annealing process to cause silicidation reaction between said nickel layer on silicon surfaces and underlying silicon, to form silicide layers; and
   etching and removing an unreacted nickel layer.

3. The method for manufacturing a semiconductor device according to claim 2, wherein said nickel layer and said nickel silicide layer contain Pt.

4. The method for manufacturing a semiconductor device according to claim 3, wherein after said implanting Al ions to dope Al in surface regions of said nickel silicide layers, Pt concentration ratio of a value at a depth of 10 nm to a value at a surface region is higher than Al concentration ratio of a value at the depth of 10 nm to a value at the surface region, in said NMOS transistor.

5. The method for manufacturing a semiconductor device according to claim 1, wherein said implanting Al ions performs ion implantation under such a condition that an Al concentration at a surface of said silicide layer becomes 1 atm% or higher and an Al concentration at an interface with silicon becomes lower than 0.5 atm%.

6. The method for manufacturing a semiconductor device according to claim 1, further comprising:
    doping n-type impurities in at least another of said plurality of active regions to form an n-type well;
    forming a PMOS gate electrode above said n-type well via a gate insulating film, traversing said n-type well at an intermediate position;
    implanting p-type impurity ions into said n-type well on both sides of said PMOS gate electrode to form p-type extension regions;
    forming PMOS gate side wall spacers on side walls of said PMOS gate electrode, at a same time as said forming said NMOS gate side wall spacers;
    implanting p-type impurity ions into said n-type well outside said PMOS gate side wall spacers to form p-type source/drain regions;
    forming a nickel silicide layer in surface regions of said p-type source/drain regions, at a same time as said forming a nickel silicide layer in surface regions of said n-type source/drain regions; and
    forming a hard mask layer for masking said n-type well prior to said implanting Al ions to dope Al in the surface regions of said nickel silicide layers,
    wherein said implanting Al ions to dope Al in surface regions of said nickel silicide layers implants Al ions by using said hard mask layer as a mask.

7. The method for manufacturing a semiconductor device according to claim 6, wherein said hard mask layer is removed after said implanting Al ions to dope Al in surface regions of said nickel silicide layers.

8. The method for manufacturing a semiconductor device according to claim 6, wherein said hard mask layer is a compressive stress insulating film having a compressive stress.

9. The method for manufacturing a semiconductor device according to claim 8, further comprising:
    depositing a tensile stress insulating film having a tensile stress above said silicon substrate, after said implanting Al ions to dope Al in surface regions of said nickel silicide layers; and
    removing said tensile stress insulating film above said n-type well.

10. The method for manufacturing a semiconductor device according to claim 9, wherein said compressive stress insulating film and said tensile stress insulating film are silicon nitride films formed under different film forming conditions.

* * * * *